(12) United States Patent
Konaka

(10) Patent No.: US 10,630,260 B2
(45) Date of Patent: Apr. 21, 2020

(54) ELASTIC WAVE APPARATUS AND DUPLEXER

(71) Applicant: Murata Manufacturing Co., Ltd., Nagaokakyo-shi, Kyoto-fu (JP)

(72) Inventor: Yohei Konaka, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 104 days.

(21) Appl. No.: 16/111,274

(22) Filed: Aug. 24, 2018

(65) Prior Publication Data

US 2018/0367120 A1    Dec. 20, 2018

Related U.S. Application Data

(63) Continuation of application No. PCT/JP2016/080972, filed on Oct. 19, 2016.

(30) Foreign Application Priority Data

Mar. 8, 2016 (JP) .................. 2016-044127

(51) Int. Cl.
*H03H 9/64* (2006.01)
*H03H 9/54* (2006.01)
*H03H 9/72* (2006.01)
*H03H 9/02* (2006.01)

(52) U.S. Cl.
CPC ...... *H03H 9/6483* (2013.01); *H03H 9/02834* (2013.01); *H03H 9/542* (2013.01); *H03H 9/6423* (2013.01); *H03H 9/725* (2013.01); *H03H 9/02574* (2013.01)

(58) Field of Classification Search
CPC .......... H03H 9/02574; H03H 9/02834; H03H 9/542; H03H 9/6423; H03H 9/6483; H03H 9/725
USPC ........................... 333/133, 193, 195
See application file for complete search history.

(56) References Cited

U.S. PATENT DOCUMENTS

| 5,694,095 A * | 12/1997 | Mineyoshi ........... H03H 9/0542 |
| | | 310/313 R |
| 6,593,678 B1 * | 7/2003 | Flowers ............... H03H 9/0542 |
| | | 310/313 R |
| 7,046,102 B2 * | 5/2006 | Nakamura ........... H03H 9/0038 |
| | | 333/133 |

(Continued)

FOREIGN PATENT DOCUMENTS

| JP | 02-177712 A * | 7/1990 |
| JP | 05-022074 A * | 1/1993 |

(Continued)

OTHER PUBLICATIONS

Official Communication issued in International Patent Application No. PCT/JP2016/080972, dated Dec. 6, 2016.

*Primary Examiner* — Barbara Summons
(74) *Attorney, Agent, or Firm* — Keating & Bennett, LLP

(57) ABSTRACT

An elastic wave apparatus includes a piezoelectric substrate, a first dielectric film provided on the piezoelectric substrate, an IDT electrode provided on the first dielectric film, and a capacitor that includes a pair of comb-shaped electrodes provided directly on the piezoelectric substrate and is electrically connected to the IDT electrode. An elastic wave resonator including the IDT electrode is provided.

19 Claims, 5 Drawing Sheets

(56) References Cited

U.S. PATENT DOCUMENTS

| | | | |
|---|---|---|---|
| 8,179,211 B2 * | 5/2012 | Bauer | H03H 9/0542 |
| | | | 333/193 |
| 9,608,595 B1 * | 3/2017 | Raihn | H03H 9/54 |
| 2008/0061657 A1 | 3/2008 | Matsuda et al. | |
| 2008/0067891 A1 | 3/2008 | Matsuda et al. | |
| 2008/0129418 A1 * | 6/2008 | Miura | H03H 9/6483 |
| | | | 333/195 |
| 2010/0187947 A1 | 7/2010 | Mimura | |

FOREIGN PATENT DOCUMENTS

| | | | |
|---|---|---|---|
| JP | 06-232678 A | * | 8/1994 |
| JP | 08-065089 A | * | 3/1996 |
| JP | 2005-260833 A | | 9/2005 |
| JP | 2005-260909 A | | 9/2005 |
| JP | 2008-067289 A | | 3/2008 |
| JP | 2008-078739 A | | 4/2008 |
| JP | 2010-193429 A | | 9/2010 |
| JP | 2012-049758 A | | 3/2012 |
| JP | 2012-147175 A | | 8/2012 |

* cited by examiner

ELASTIC WAVE APPARATUS AND DUPLEXER

CROSS REFERENCE TO RELATED APPLICATIONS

This application claims the benefit of priority to Japanese Patent Application No. 2016-044127 filed on Mar. 8, 2016 and is a Continuation Application of PCT Application No. PCT/JP2016/080972 filed on Oct. 19, 2016. The entire contents of each application are hereby incorporated herein by reference.

BACKGROUND OF THE INVENTION

1. Field of the Invention

The present invention relates to an elastic wave apparatus and a duplexer including the elastic wave apparatus.

2. Description of the Related Art

Elastic wave apparatuses have been used in, for example, band-pass filters and duplexers in cellular phones.

Japanese Unexamined Patent Application Publication No. 2012-049758 discloses an example of an elastic wave apparatus. This elastic wave apparatus includes an IDT electrode and a capacitive electrode. The IDT electrode and the capacitive electrode are formed of the same metal layer. The capacitance of the capacitive electrode can therefore be easily adjusted.

On the other hand, in the elastic wave apparatus disclosed in Japanese Unexamined Patent Application Publication No. 2005-260909, for the adjustment of an electromechanical coupling coefficient and the optimum setting of a passband width, an insulating film is provided between an IDT electrode and a piezoelectric substrate.

In a case in which the configuration disclosed in Japanese Unexamined Patent Application Publication No. 2012-049758 is used in the configuration of the elastic wave apparatus disclosed in Japanese Unexamined Patent Application Publication No. 2005-260909 with which a passband width can be adjusted, the capacitance of the capacitive electrode changes in accordance with the thickness of the insulating film. This leads to large variations in filter characteristics. Especially when a capacitive electrode is used as a bridging capacitance, the influence on filter characteristics is increased. Accordingly, sufficient steepness and sufficient attenuation characteristics are not obtained in some cases.

SUMMARY OF THE INVENTION

Preferred embodiments of the present invention provide elastic wave apparatuses capable of effectively improving steepness in a vicinity of an edge portion of a passband and an out-of-band attenuation, and duplexers capable of effectively improving steepness in the vicinity of the edge portion of a passband and isolation characteristics.

An elastic wave apparatus according to a preferred embodiment of the present invention includes a piezoelectric substrate, a first dielectric film provided on the piezoelectric substrate, an IDT electrode provided on the first dielectric film, and a capacitor that includes a pair of comb-shaped electrodes provided directly on the piezoelectric substrate and is electrically connected to the IDT electrode. An elastic wave resonator including the IDT electrode is provided.

In an elastic wave apparatus according to a preferred embodiment of the present invention, the elastic wave apparatus further includes a second dielectric film provided on the piezoelectric substrate to cover the elastic wave resonator and the capacitor. A density of a material from which the IDT electrode is made is higher than a density of a material from which the second dielectric film is made. In this case, steepness in the vicinity of the edge portion of a passband and an out-of-band attenuation are able to be more effectively improved.

In an elastic wave apparatus according to a preferred embodiment of the present invention, an elastic wave propagation direction in the elastic wave resonator and an elastic wave propagation direction in the capacitor cross each other. In this case, the influence of an elastic wave excited by the capacitor on an elastic wave resonator is reduced.

In an elastic wave apparatus according to a preferred embodiment of the present invention, an elastic wave propagation direction in the elastic wave resonator and an elastic wave propagation direction in the capacitor are orthogonal or substantially orthogonal to each other. In this case, the influence of an elastic wave excited by the capacitor on an elastic wave resonator is further reduced.

In an elastic wave apparatus according to a preferred embodiment of the present invention, the capacitor includes laminated metal films and at least one of a diffusion barrier layer and an adhesion layer.

In an elastic wave apparatus according to a preferred embodiment of the present invention, the piezoelectric substrate is made of $LiNbO_3$.

In an elastic wave apparatus according to a preferred embodiment of the present invention, the elastic wave apparatus uses a Love wave. In this case, steepness in the vicinity of the edge portion of the passband on the higher-frequency side and an out-of-band attenuation are especially effectively improved.

In an elastic wave apparatus according to a preferred embodiment of the present invention, the elastic wave apparatus is a ladder filter including a series arm resonator and a parallel arm resonator, the series arm resonator and the parallel arm resonator are defined by the elastic wave resonators, and the capacitor is connected in parallel to at least one of the series arm resonators. In this case, steepness in the vicinity of the edge portion of the passband on the higher-frequency side and an out-of-band attenuation are especially effectively improved.

In an elastic wave apparatus according to a preferred embodiment of the present invention, the elastic wave apparatus is a ladder filter including a series arm resonator and a parallel arm resonator, the series arm resonator and the parallel arm resonator are defined by the elastic wave resonators, and the capacitor is connected in parallel to at least one of the parallel arm resonators.

A duplexer according to a preferred embodiment of the present invention includes a first band-pass filter defined by an elastic wave apparatus according to a preferred embodiment of the present invention and a second band-pass filter having a passband different from a passband of the first band-pass filter.

With elastic wave apparatuses according to preferred embodiments of the present invention, steepness in the vicinity of the edge portion of a passband and an out-of-band attenuation are effectively improved. With duplexers according to preferred embodiments of the present invention, steepness in the vicinity of the edge portion of a passband and isolation characteristics are effectively improved.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention will be clarified below through the description of specific preferred embodiments of the present invention with reference to the accompanying drawings.

It is to be noted that the preferred embodiments described herein are merely examples, and that the configurations in the preferred embodiments are able to be partially replaced or combined between different preferred embodiments.

Figure 1:
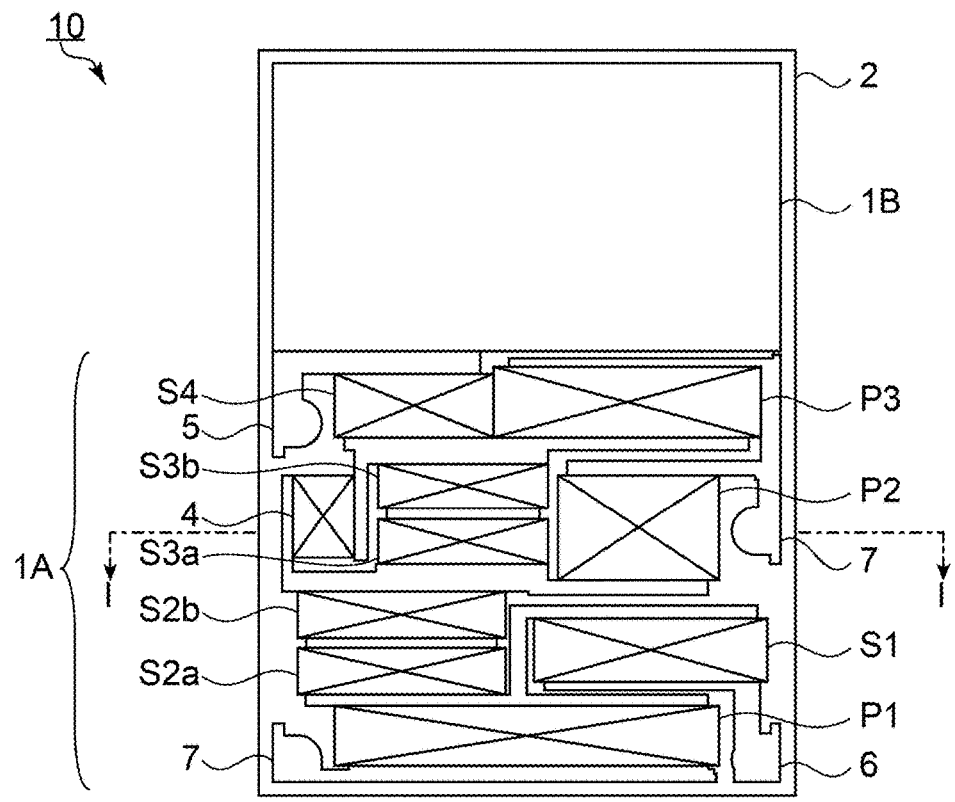
FIG. 1 is a schematic plan view of a duplexer according to a preferred embodiment of the present invention illustrating the electrode configuration of the duplexer.
Figure 2:
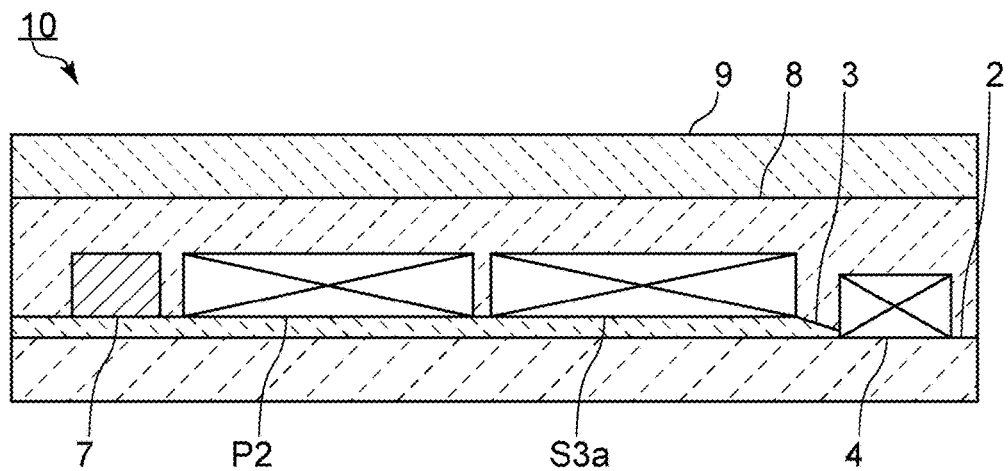
FIG. 2 is a schematic cross-sectional view of the duplexer along a line I-I in FIG. 1.
Figure 4:
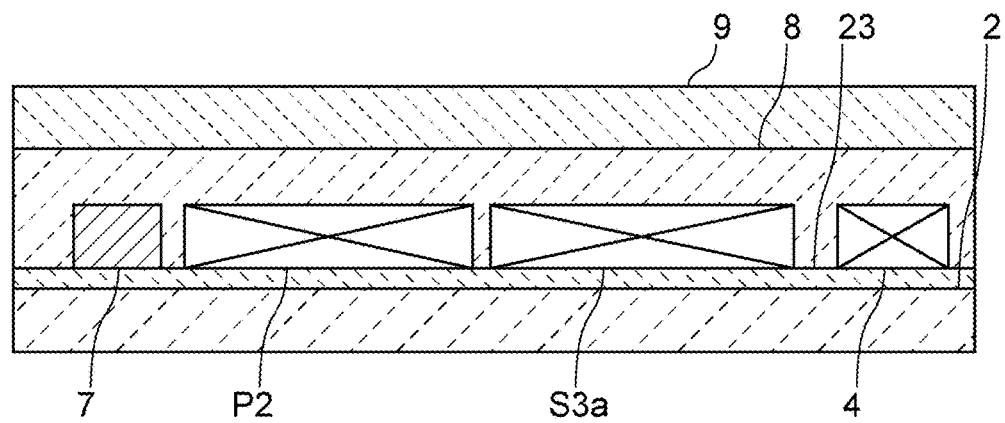
FIG. 4 is a schematic cross-sectional view of a duplexer that is a second comparative example.

FIG. 1 is a schematic plan view of a duplexer according to a preferred embodiment of the present invention illustrating the electrode configuration of the duplexer. FIG. 2 is a schematic cross-sectional view of the duplexer along a line I-I in FIG. 1. In FIGS. 1 and 2 and FIG. 4 to be described below, each elastic wave resonator is schematically illustrated by a rectangle in which two diagonal lines are drawn. In FIG. 1, the illustration of the configuration of a second band-pass filter to be described below is omitted.

As illustrated in FIG. 1, a duplexer 10 includes a piezoelectric substrate 2. The piezoelectric substrate 2 is preferably made of $LiNbO_3$, for example. The piezoelectric substrate 2 may be made of a piezoelectric monocrystal other than $LiNbO_3$, such as $LiTaO_3$, or piezoelectric ceramic, for example.

As illustrated in FIG. 2, on the piezoelectric substrate 2, a first dielectric film 3 is provided. The first dielectric film 3 is preferably made of $SiO_2$, for example. The first dielectric film 3 may be made of a dielectric other than $SiO_2$, such as tantalum pentoxide, for example.

A plurality of IDT electrodes are provided on the first dielectric film 3. The application of an alternating voltage to each IDT electrode excites an elastic wave. Reflectors are provided on both sides of each IDT electrode in an elastic wave propagation direction. As a result, a plurality of elastic wave resonators are provided. The IDT electrodes provided on the first dielectric film 3 reduce the electromechanical coupling coefficients of respective elastic wave resonators.

The non-limiting metallic material of each IDT electrode may be Pt, Mo, or Cu, for example. Each IDT electrode may include a single-layer metal film or laminated metal films. The thicknesses of each IDT electrode and each reflector are preferably in the range between about 250 nm and about 350 nm, for example, but do not necessarily have to be in the range.

As illustrated in FIG. 1, the duplexer 10 includes a first band-pass filter 1A including the above-described elastic wave resonators and a second band-pass filter 1B including the above-described elastic wave resonators. The passbands of the first band-pass filter 1A and the second band-pass filter 1B are different from each other. The first band-pass filter 1A is preferably a transmission filter. The second band-pass filter 1B is preferably a reception filter. The first band-pass filter 1A is an elastic wave apparatus according to a preferred embodiment of the present invention.

The duplexer 10 according to the present preferred embodiment preferably uses a Love wave, for example. The duplexer 10 may use an elastic wave other than the Love wave.

The duplexer 10 includes a capacitor 4 including a pair of comb-shaped electrodes. The capacitor 4 is directly provided on the piezoelectric substrate 2. In the specification, this means that the capacitor 4 is provided on the piezoelectric substrate 2 not via the first dielectric film 3. For example, the capacitor 4 may be provided on the piezoelectric substrate 2 via a layer other than the first dielectric film 3. Each comb-shaped electrode includes a plurality of electrode fingers and a bus bar to which one ends of the electrode fingers are connected. A plurality of electrode fingers in a pair of comb-shaped electrodes are interdigitated with each other. The thickness of the capacitor 4 is preferably in the range between about 250 nm and about 350 nm, for example, but does not necessarily have to be in the range. The capacitor 4 preferably has the capacitance of about 2.1 pF, for example, in the present preferred embodiment, but does not necessarily have to have that capacitance.

The capacitor 4 may include a single-layer metal film or laminated metal films. In a case in which the capacitor 4 includes laminated metal films, the capacitor 4 may preferably include, for example, at least one of a diffusion barrier layer and an adhesion layer.

In the present preferred embodiment, the first dielectric film 3 illustrated in FIG. 2 includes a sloped portion whose thickness decreases toward the capacitor 4. The first dielectric film 3 is not provided on a portion of the piezoelectric substrate 2 at which the capacitor 4 is disposed. The first dielectric film 3 does not necessarily have to include a sloped portion.

Figure 3:
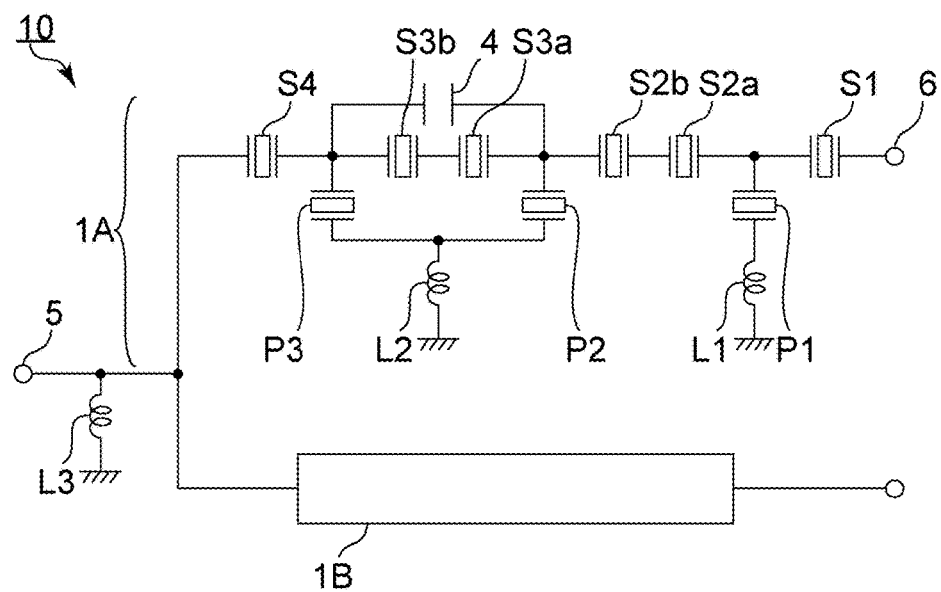
FIG. 3 is a circuit diagram of a duplexer according to a preferred embodiment of the present invention.

FIG. 3 is a circuit diagram of a duplexer according to a preferred embodiment of the present invention. In FIG. 3, the illustration of the configuration of the second band-pass filter is omitted.

The first band-pass filter 1A is preferably a ladder filter, for example, including series arm resonators S1, S2a, S2b, S3a, S3b, and S4 and parallel arm resonators P1 to P3 that are defined by the above-described elastic wave resonators.

The duplexer 10 includes an antenna terminal 5 connected to an antenna and an input terminal 6. Between the antenna terminal 5 and the input terminal 6, the series arm resonators S1, S2a, S2b, S3a, S3b, and S4 are connected in series. Between a ground potential and a node between the series arm resonators S1 and S2a, the parallel arm resonator P1 is connected. Between the ground potential and a node between the series arm resonators S2b and S3a, the parallel arm resonator P2 is connected. Between the ground potential and a node between the series arm resonators S3b and S4, the parallel arm resonator P3 is connected.

Between the parallel arm resonator P1 and the ground potential, an inductor L1 is connected. The parallel arm resonators P2 and P3 are connected in common to the ground potential. Between the ground potential and the parallel arm resonators P2 and P3, the inductor L2 is connected. Between the antenna terminal 5 and the ground potential, an inductor L3 is connected. The inductor L3 is an inductor for the adjustment of characteristics.

The capacitor 4 is connected in parallel to the series arm resonators S3a and S3b. Thus, in the present preferred embodiment, the capacitor 4 is a bridging capacitance. The first band-pass filter 1A may have any circuit configuration as long as it includes the capacitor 4 and the above-described elastic wave resonators. For example, the capacitor 4 may be connected in parallel to at least one series arm resonator. The capacitor 4 may be connected in parallel to at least one parallel arm resonator. The second band-pass filter 1B may also have any circuit configuration.

Referring back to FIG. 1, a plurality of ground terminals are provided on the piezoelectric substrate 2. Each of the ground terminals 7 is connected to the ground potential.

As illustrated in FIG. 2, a second dielectric film 8 is provided on the piezoelectric substrate 2 and covers the elastic wave resonators and the capacitor 4. The second dielectric film is a temperature-characteristics compensation film. The presence of the second dielectric film 8 reduces the absolute value of frequency temperature characteristics. The second dielectric film 8 is preferably made of $SiO_2$, for example. The second dielectric film 8 may be made of a dielectric other than $SiO_2$, such as tantalum pentoxide, for example.

A third dielectric film 9 is provided on the second dielectric film 8. The third dielectric film 9 improves moisture resistance. The third dielectric film 9 is preferably made of SiN, for example. The third dielectric film 9 may be made of a dielectric other than SiN. The duplexer 10 does not necessarily have to include the second dielectric film 8 or the third dielectric film 9.

The specifications of the series arm resonators S1, S2a, S2b, S3a, S3b, and S4 and the parallel arm resonators P1 to P3 in the first band-pass filter 1A illustrated in FIG. 1 are as represented by, for example, Table 1. In the capacitor 4, for example, preferably, the number of pairs of electrode fingers is about 57, an electrode finger pitch is about 1.4 μm, and a cross width is about 116.24 μm. The cross width is the length of a portion in which adjacent electrode fingers cross each other when viewed from the elastic wave propagation direction.

TABLE 1

| | IDT electrode | | | Reflector | |
|---|---|---|---|---|---|
| | The number of pairs of electrode fingers (pair) | Cross width (μm) | Electrode finger pitch (μm) | The number of electrode fingers (finger) | Electrode finger pitch (μm) |
| Series arm resonator S1 | 94 | 108.47 | 4.458 | 10 | 4.458 |

TABLE 1-continued

| | IDT electrode | | | Reflector | |
|---|---|---|---|---|---|
| | The number of pairs of electrode fingers (pair) | Cross width (μm) | Electrode finger pitch (μm) | The number of electrode fingers (finger) | Electrode finger pitch (μm) |
| Series arm resonator S2a | 83 | 76.92 | 4.423 | 10 | 4.423 |
| Series arm resonator S2b | 83 | 76.92 | 4.423 | 10 | 4.423 |
| Series arm resonator S3a | 67 | 75.92 | 4.371 | 10 | 4.371 |
| Series arm resonator S3b | 67 | 75.92 | 4.371 | 10 | 4.371 |
| Series arm resonator S4 | 60 | 107.09 | 4.443 | 10 | 4.443 |
| Parallel arm resonator P1 | 151 | 103.53 | 4.677 | 10 | 4.677 |
| Parallel arm resonator P2 | 60 | 194.68 | 4.620 | 10 | 4.620 |
| Parallel arm resonator P3 | 101 | 120.742 | 4.654 | 10 | 4.654 |

In the present preferred embodiment, the elastic wave resonators are provided on the first dielectric film 3 and the capacitor 4 is provided directly on the piezoelectric substrate 2. With these features, steepness in the vicinity of the edge portion of a passband is increased and isolation characteristics are improved. These effects will be described below by comparing the present preferred embodiment with first to fourth comparative examples.

In the specification, high steepness means that the amount of change in frequency is small with respect to a certain amount of change in attenuation in the vicinity of an edge portion of a passband.

A duplexer according to the first comparative example differs from a duplexer according to the present preferred embodiment in that the duplexer does not include a capacitor. A duplexer illustrated in FIG. 4 which is the second comparative example differs from a duplexer according to the present preferred embodiment in that the capacitor 4 is provided on a first dielectric film 23. Duplexers according to third and fourth comparative examples include first dielectric films similar to the duplexer according to the second comparative example. Duplexers according to the second to fourth comparative examples have similar configurations, with the exception that the thicknesses of the first dielectric films in these duplexers differ from one another.

A duplexer according to the present preferred embodiment and duplexers according to the first to fourth comparative examples were produced and the attenuation-frequency characteristics and isolation characteristics of first band-pass filters in the respective duplexers were compared. The thickness of the first dielectric film in the duplexer according to the second comparative example was set to about 16.3 nm. The thickness of the first dielectric film in the duplexer according to the third comparative example was set to about 17.9 nm. The thickness of the first dielectric film in the duplexer according to the fourth comparative example was set to about 19.5 nm. That is, in the second to fourth comparative examples, the thickness of the first dielectric film is about 17.9 nm ±about 1.6 nm.

Figure 5:
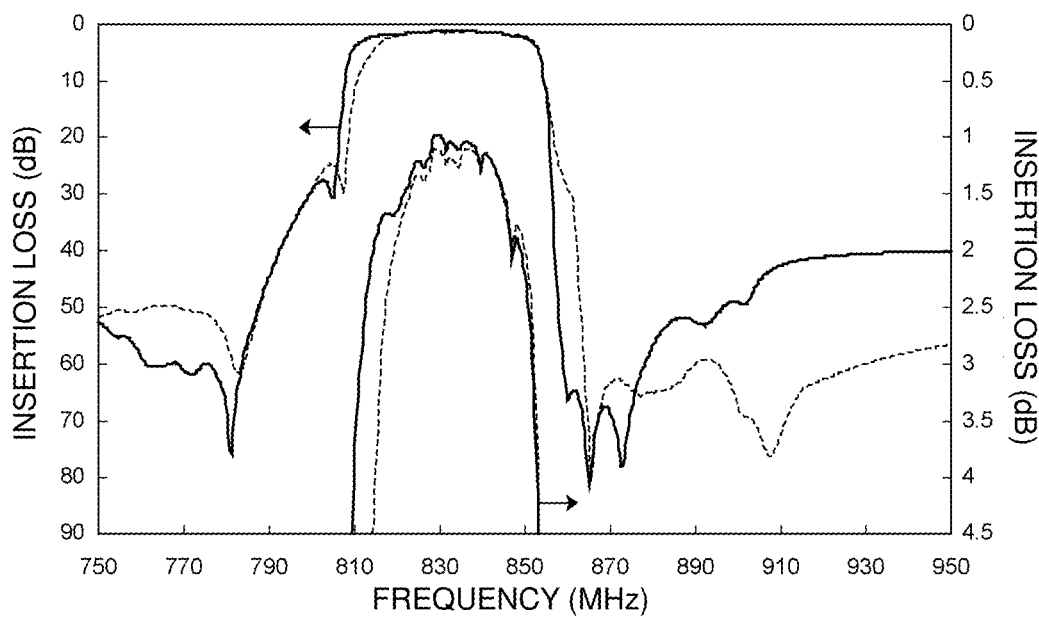
FIG. 5 is a diagram illustrating the attenuation-frequency characteristics of a first band-pass filter according to a preferred embodiment of the present invention and a first band-pass filter in a first comparative example.

FIG. 5 is a diagram illustrating the attenuation-frequency characteristics of the first band-pass filters in the present preferred embodiment and the first comparative example.

Figure 6:
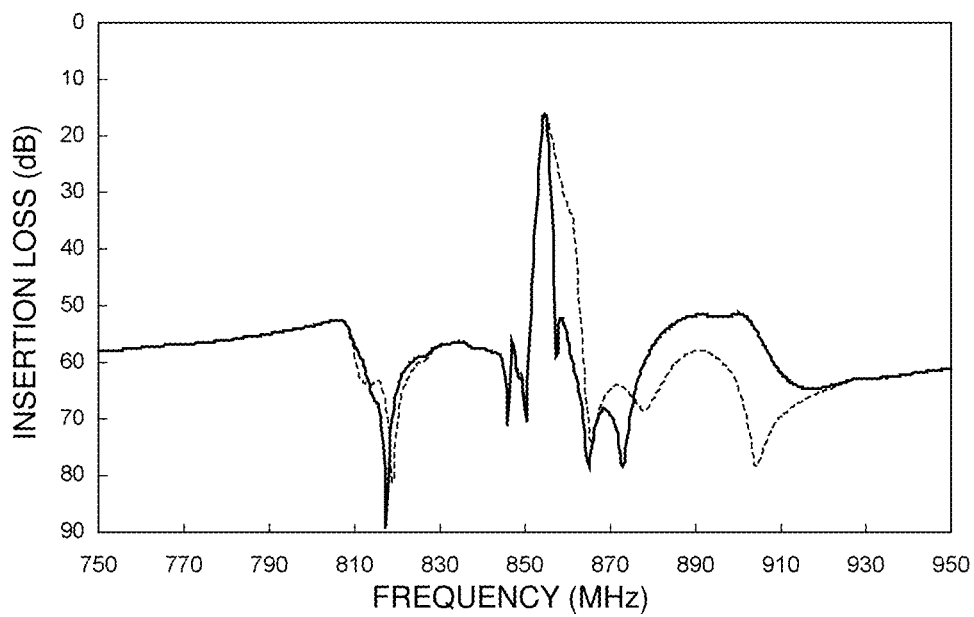
FIG. 6 is a diagram illustrating the isolation characteristics of a duplexer according to a preferred embodiment of the present invention and a duplexer that is the first comparative example.

FIG. 6 is a diagram illustrating the isolation characteristics of a duplexer according to the present preferred embodiment and a duplexer according to the first comparative example. In FIGS. 5 and 6, a solid line represents a result in the present preferred embodiment and a broken line represents a result in the first comparative example.

As is apparent from FIG. 5, steepness is low at both edge portions of a passband in the first comparative example. In contrast, steepness is increased at both edge portions of a passband in the present preferred embodiment as compared to the first comparative example. In addition, an out-of-band attenuation is increased in the vicinity of the passband in the present preferred embodiment as compared to the first comparative example. A duplexer according to the present preferred embodiment including the above-described capacitor effectively increases steepness and increases the out-of-band attenuation of the first band-pass filter.

As is apparent from FIG. 6, isolation characteristics are degraded in the first comparative example. In contrast, in the present preferred embodiment, isolation characteristics are improved.

Figure 7A:
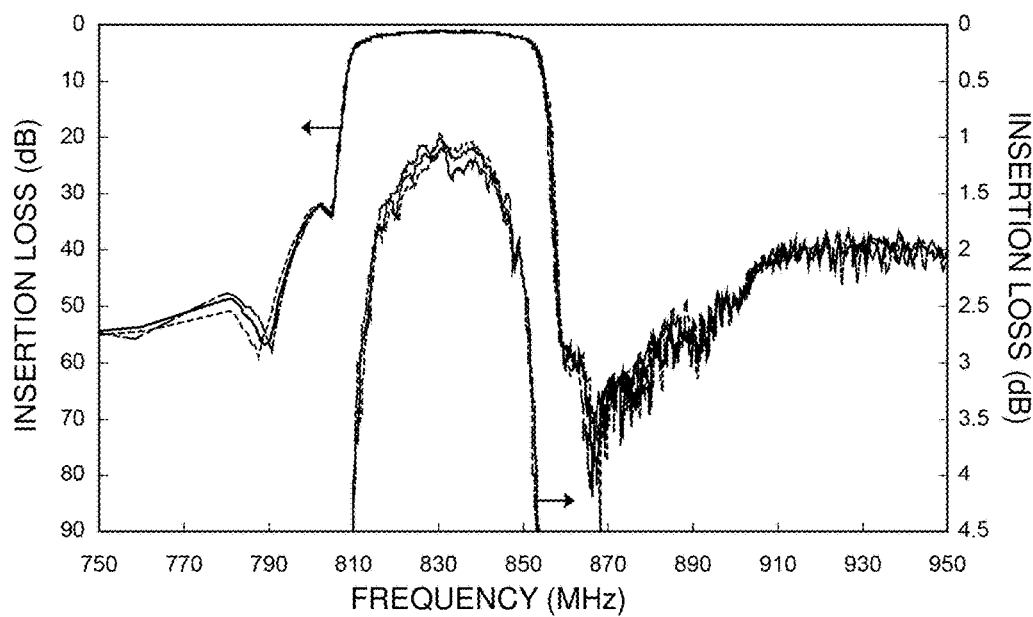
FIG. 7A is a diagram illustrating the attenuation-frequency characteristics of first band-pass filters in second to fourth comparative examples.
Figure 7B:
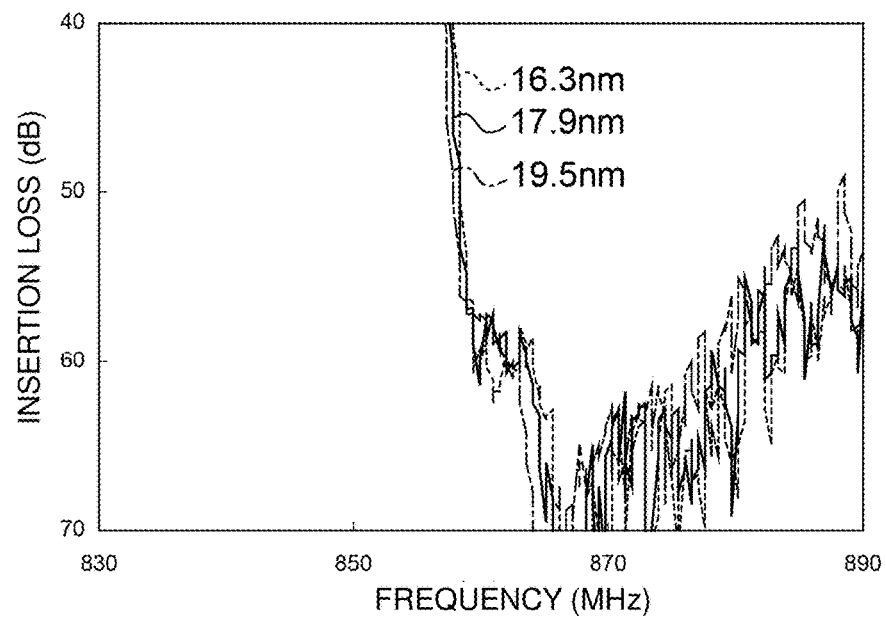
FIG. 7B is an enlarged view of FIG. 7A.
Figure 8A:
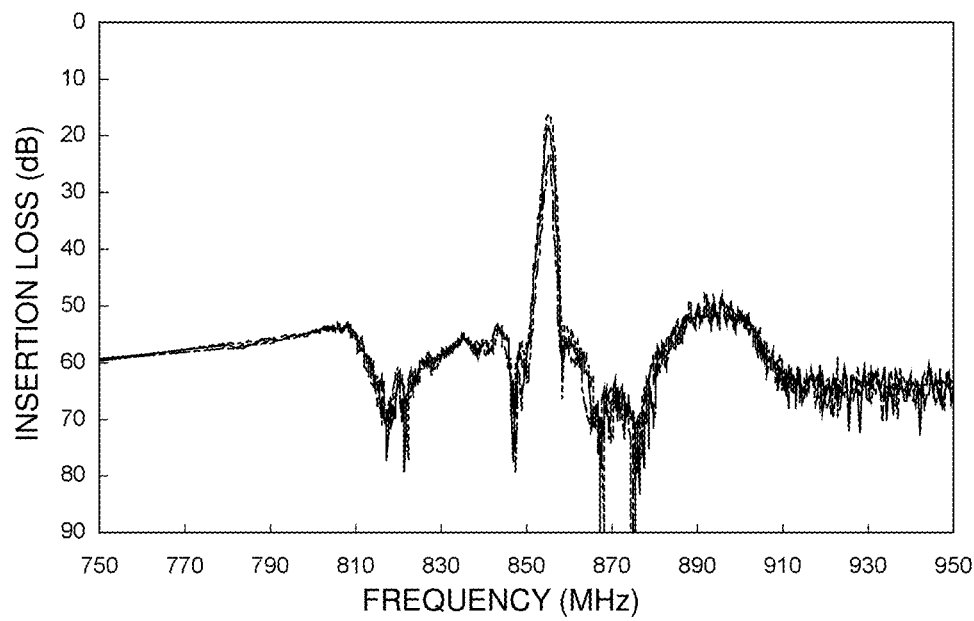
FIG. 8A is a diagram illustrating the isolation characteristics of duplexers that are the second to fourth comparative examples.
Figure 8B:
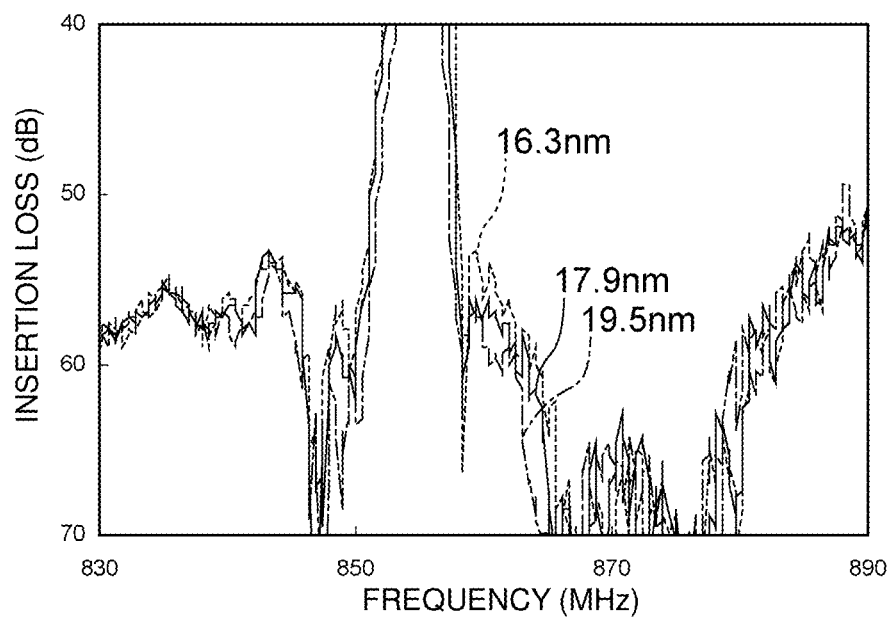
FIG. 8B is an enlarged view of FIG. 8A.

FIG. 7A is a diagram illustrating the attenuation-frequency characteristics of the first band-pass filters in the second to fourth comparative examples. FIG. 7B is an enlarged view of FIG. 7A. FIG. 8A is a diagram illustrating the isolation characteristics of duplexers that are the second to fourth comparative examples. FIG. 8B is an enlarged view of FIG. 8A. In FIGS. 7A, 7B, 8A, and 8B, a broken line represents a result in the second comparative example in which the thickness of the first dielectric film is about 16.3 nm. A solid line represents a result in the third comparative example in which the thickness of the first dielectric film is about 17.9 nm. A dot-and-dash line represents a result in the fourth comparative example in which the thickness of the first dielectric film is about 19.5 nm.

As is apparent from FIGS. 7A and 7B, in the vicinity of the edge portion of the passband on the higher-frequency side, steepness varies widely in the second to fourth comparative examples. As is apparent from FIGS. 8A and 8B, steepness of isolation characteristics also varies widely in the second to fourth comparative examples. In addition, an attenuation also varies widely in the vicinity of about 860 MHz. The reason for this is that the capacitance of the capacitor provided on the first dielectric film varies in accordance with the thickness of the first dielectric film.

That is, even if the thickness of the first dielectric film is able to be accurately controlled in the range of about 17.9 nm ±about 1.6 nm, steepness in the vicinity of the edge portion of the passband on the higher-frequency side and isolation characteristics vary widely. Thus, in the second to fourth comparative examples, it is difficult to sufficiently improve the steepness and the isolation characteristics with certainty.

In contrast, as illustrated in FIG. 2, the capacitor 4 is provided directly on the piezoelectric substrate 2 in the present preferred embodiment. The capacitance of the capacitor 4 therefore does not depend on the thickness of the first dielectric film 3. Accordingly, the variations in steepness in the vicinity of the edge portion of the passband on the higher-frequency side and isolation characteristics are reduced or prevented with certainty. As a result, the steepness and the isolation characteristics are effectively improved. Meanwhile, steepness in the vicinity of the edge portion of the passband of the first band-pass filter on the higher-frequency side and an out-of-band attenuation are effectively improved.

Since there is no need to adjust the thickness of the first dielectric film 3 in order to adjust the capacitance of the capacitor 4, the degree of flexibility in setting the target value of thickness of the first dielectric film 3 is increased. This leads to further improvement of filter characteristics, such as an insertion loss.

It is preferable that an elastic wave propagation direction in each elastic wave resonator and an elastic wave propagation direction in the capacitor 4 cross each other. This reduces or prevents the influence of an elastic wave excited in the capacitor 4 on each elastic wave resonator. It is more preferable that an elastic wave propagation direction in each elastic wave resonator and an elastic wave propagation direction in the capacitor 4 are orthogonal or substantially orthogonal to each other. This further reduces or prevents the influence of an elastic wave excited in the capacitor 4 on each elastic wave resonator.

It is preferable that the density of the material from which the IDT electrode is made be higher than that of the material from which the second dielectric film 8 is made. In this case, preferred embodiments of the present invention are able to be specifically preferably applied.

As in the above-described preferred embodiment of the present invention, it is preferable that a Love wave, for example, be used. Also in this case, preferred embodiments of the present invention are able to be specifically preferably applied.

As described above, the first band-pass filter 1A illustrated in FIG. 3 may have any circuit configuration. However, in a case in which a configuration is provided in which a bridging capacitance connected in parallel to at least one series arm resonator is used as the capacitor 4 described in the above-described preferred embodiment, steepness in the vicinity of the edge portion of the passband on the higher-frequency side and an out-of-band attenuation are more effectively improved.

Preferred embodiments of the present invention are not limited to elastic wave apparatuses, such as band-pass filters and duplexers, and may preferably be applied to multiplexers for which a larger out-of-band attenuation is required. Preferred embodiments of the present invention are also preferably applied to modules in which band-pass filters, duplexers, or multiplexers are disposed on a mount board.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. An elastic wave apparatus comprising:
a piezoelectric substrate;
a first dielectric film provided on the piezoelectric substrate;
an IDT electrode provided on the first dielectric film; and
a capacitor including a pair of comb-shaped electrodes provided directly on the piezoelectric substrate and being electrically connected to the IDT electrode; wherein
an elastic wave resonator including the IDT electrode is provided.
2. The elastic wave apparatus according to claim 1, further comprising:
a second dielectric film provided on the piezoelectric substrate to cover the elastic wave resonator and the capacitor; wherein a density of a material from which the IDT electrode is made is higher than a density of a material from which the second dielectric film is made.

3. The elastic wave apparatus according to claim 1, wherein an elastic wave propagation direction in the elastic wave resonator and an elastic wave propagation direction in the capacitor cross each other.

4. The elastic wave apparatus according to claim 3, wherein an elastic wave propagation direction in the elastic wave resonator and an elastic wave propagation direction in the capacitor are orthogonal or substantially orthogonal to each other.

5. The elastic wave apparatus according to claim 1, wherein the capacitor includes laminated metal films and at least one of a diffusion barrier layer and an adhesion layer.

6. The elastic wave apparatus according to claim 1, wherein the piezoelectric substrate is made of $LiNbO_3$.

7. The elastic wave apparatus according to claim 6, wherein the elastic wave apparatus uses a Love wave.

8. The elastic wave apparatus according to claim 1, wherein
the elastic wave apparatus is a ladder filter including at least one series arm resonator and at least one parallel arm resonator;
each of the at least one series arm resonator and the at least one parallel arm resonator are defined by the elastic wave resonator; and
the capacitor is connected in parallel to at least one of the at least one series arm resonator.

9. A duplexer comprising:
the elastic wave apparatus according to claim 8 defining a first band-pass filter; and
a second band-pass filter having a passband different from a passband of the first band-pass filter.

10. The duplexer according to claim 9, further comprising:
a second dielectric film provided on the piezoelectric substrate to cover the elastic wave resonator and the capacitor; wherein
a density of a material from which the IDT electrode is made is higher than a density of a material from which the second dielectric film is made.

11. The duplexer according to claim 9, wherein an elastic wave propagation direction in the elastic wave resonator and an elastic wave propagation direction in the capacitor cross each other.

12. The duplexer according to claim 11, wherein an elastic wave propagation direction in the elastic wave resonator and an elastic wave propagation direction in the capacitor are orthogonal or substantially orthogonal to each other.

13. The duplexer according to claim 9, wherein the capacitor includes laminated metal films and at least one of a diffusion barrier layer and an adhesion layer.

14. The elastic wave apparatus according to claim 1, wherein
the elastic wave apparatus is a ladder filter including at least one series arm resonator and at least one parallel arm resonator;
each of the at least one series arm resonator and the at least one parallel arm resonator is defined by the elastic wave resonator; and
the capacitor is connected in parallel to at least one of the at least one parallel arm resonator.

15. A duplexer comprising:
the elastic wave apparatus according to claim 14 defining a first band-pass filter; and
a second band-pass filter having a passband different from a passband of the first band-pass filter.

16. The duplexer according to claim 15, further comprising:
a second dielectric film provided on the piezoelectric substrate to cover the elastic wave resonator and the capacitor; wherein
a density of a material from which the IDT electrode is made is higher than a density of a material from which the second dielectric film is made.

17. The duplexer according to claim 15, wherein an elastic wave propagation direction in the elastic wave resonator and an elastic wave propagation direction in the capacitor cross each other.

18. The duplexer according to claim 17, wherein an elastic wave propagation direction in the elastic wave resonator and an elastic wave propagation direction in the capacitor are orthogonal or substantially orthogonal to each other.

19. The duplexer according to claim 15, wherein the capacitor includes laminated metal films and at least one of a diffusion barrier layer and an adhesion layer.

* * * * *